(12) United States Patent
Kim et al.

(10) Patent No.: US 9,898,911 B2
(45) Date of Patent: Feb. 20, 2018

(54) FIRE DETECTING DEVICE INCLUDING METAL-INSULATOR TRANSITION (MIT) DEVICE MOLDED BY CLEAR COMPOUND EPOXY

(71) Applicant: ELECTRONICS AND TELECOMMUNICATIONS RESEARCH INSTITUTE, Daejeon (KR)

(72) Inventors: Hyun-Tak Kim, Daejeon (KR); Bongjun Kim, Daejeon (KR); Jong Chan Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/592,830

(22) Filed: May 11, 2017

(65) Prior Publication Data
US 2017/0249818 A1    Aug. 31, 2017

Related U.S. Application Data

(62) Division of application No. 14/240,335, filed as application No. PCT/KR2012/006501 on Aug. 16, 2012, now Pat. No. 9,660,190.

(30) Foreign Application Priority Data

Aug. 22, 2011   (KR) .................. 10-2011-0083660
Nov. 25, 2011   (KR) .................. 10-2011-0124220

(51) Int. Cl.
*G08B 17/06*      (2006.01)
*H01C 7/04*       (2006.01)
(Continued)

(52) U.S. Cl.
CPC ............ *G08B 17/06* (2013.01); *H01C 7/047* (2013.01); *H01H 37/32* (2013.01);
(Continued)

(58) Field of Classification Search
CPC ........ G08B 17/06; G01C 7/047; H01H 37/32; H01L 27/0248; H01L 27/0647; H01L 49/003; H02H 9/045
See application file for complete search history.

(56) References Cited

U.S. PATENT DOCUMENTS 5,942,797 A * 8/1999 Terasawa ............. H01L 25/162
                                                                257/703
6,700,194 B2 * 3/2004 Nakajima ............. H01L 21/565
                                                                257/701
(Continued)

FOREIGN PATENT DOCUMENTS

KR         20-0237106 Y1    9/2001
KR    20-2008-0001956 U     6/2008
(Continued)

OTHER PUBLICATIONS

Bong-Jun Kim et al., "Temperature dependence of the first-order metal-insulator transition in $VO_2$ and programmable critical temperature sensor", Applied Physics Letters 90, pp. 023515-1-023515-3, Jan. 12, 2007.

*Primary Examiner* — Ida M Soward
(74) *Attorney, Agent, or Firm* — Rabin & Berdo, P.C.

(57) ABSTRACT

The inventive concept provides MIT devices molded by clear compound epoxy and fire detecting devices including the MIT device. The fire detecting device is supplied with a power source from a power control device. The fire detecting device includes a MIT device including a MIT chip molded by a clear compound epoxy, a diode bridge circuit supplied with the power source from the power control device for providing a non-polar power source, a notice
(Continued)

circuit supplied with the non-polar power source from the diode bridge circuit for warning of a fire alarm in response to a detecting signal from the MIT device, and a stabilization circuit for maintaining the detecting signal for a certain period.

10 Claims, 14 Drawing Sheets

(51) Int. Cl.
  *H01H 37/32*   (2006.01)
  *H01L 27/02*   (2006.01)
  *H01L 27/06*   (2006.01)
  *H01L 49/00*   (2006.01)
  *H02H 9/04*   (2006.01)

(52) U.S. Cl.
  CPC ...... *H01L 27/0248* (2013.01); *H01L 27/0647* (2013.01); *H01L 49/003* (2013.01); *H02H 9/045* (2013.01)

(56) References Cited

U.S. PATENT DOCUMENTS

| | | |
|---|---|---|
| 7,138,660 B2 | 11/2006 | Ota et al. |
| 7,540,948 B2 | 6/2009 | Collier et al. |
| 7,825,574 B2 | 11/2010 | Brunner et al. |
| 7,906,789 B2 * | 3/2011 | Jung ............... H01L 25/0753 257/89 |
| 7,910,940 B2 | 3/2011 | Koike et al. |
| 8,294,165 B2 | 10/2012 | Hattori et al. |
| 8,305,221 B2 * | 11/2012 | Kim ............... H01L 49/003 257/414 |
| 8,324,798 B2 | 12/2012 | Zhang et al. |
| 8,410,699 B2 * | 4/2013 | Yu ............... F21V 3/00 315/32 |
| 8,446,082 B2 * | 5/2013 | Sanpei ............... H05K 1/056 257/99 |
| 8,571,360 B2 | 10/2013 | Tay et al. |
| 8,690,629 B2 | 4/2014 | Becker et al. |
| 8,866,375 B2 | 10/2014 | Gasse et al. |
| 8,979,318 B2 | 3/2015 | Fiedler et al. |
| 9,012,937 B2 | 4/2015 | Keller et al. |
| 9,142,743 B2 | 9/2015 | Chuang et al. |
| 9,196,800 B2 | 11/2015 | Reeh et al. |
| 2002/0121683 A1 | 9/2002 | Kelly et al. |
| 2004/0164311 A1 | 8/2004 | Uemura |
| 2007/0090389 A1 | 4/2007 | Liu et al. |
| 2008/0054280 A1 | 3/2008 | Reginelli et al. |
| 2008/0265268 A1 | 10/2008 | Braune et al. |
| 2009/0001390 A1 | 1/2009 | Yan et al. |
| 2009/0121251 A1 | 5/2009 | Kniajanski et al. |
| 2009/0233394 A1 | 9/2009 | Batres et al. |
| 2009/0321758 A1 | 12/2009 | Liu et al. |
| 2010/0022040 A1 | 1/2010 | Konishi et al. |
| 2010/0127371 A1 * | 5/2010 | Tschirbs ............... H01L 23/13 257/684 |
| 2010/0157542 A1 | 6/2010 | Choi et al. |
| 2010/0230712 A1 * | 9/2010 | Han ............... H01L 25/167 257/99 |
| 2011/0090683 A1 | 4/2011 | Petry et al. |
| 2011/0291073 A1 | 12/2011 | Jang et al. |
| 2011/0304261 A1 | 12/2011 | Winkler et al. |
| 2012/0049214 A1 * | 3/2012 | Lowes ............... H01L 25/0753 257/89 |
| 2012/0194066 A1 | 8/2012 | Nakamura et al. |
| 2012/0205674 A1 * | 8/2012 | Lee ............... C09K 11/7734 257/88 |
| 2012/0319159 A1 | 12/2012 | Nakatani et al. |
| 2014/0103386 A1 | 4/2014 | Shin et al. |
| 2016/0118563 A1 * | 4/2016 | Jung ............... H01L 25/0753 257/98 |

FOREIGN PATENT DOCUMENTS

| | | |
|---|---|---|
| KR | 10-0917600 | 9/2009 |
| KR | 10-1109667 | 1/2012 |
| KR | 10-1213471 | 12/2012 |

* cited by examiner (Clear Compound MIT)

FIRE DETECTING DEVICE INCLUDING METAL-INSULATOR TRANSITION (MIT) DEVICE MOLDED BY CLEAR COMPOUND EPOXY

CROSS-REFERENCE TO RELATED APPLICATIONS

This is a divisional application of U.S. patent application Ser. No. 14/240,335, filed on Feb. 21, 2014. Further, this patent application claims priority under 35 U.S.C. § 119 of Korean Patent Application Nos. 10-2011-0124220, filed on Nov. 25, 2011 and 10-2011-0083660, filed on Aug. 22, 2011. The entire contents of these prior U.S. and Korean applications are hereby incorporated by reference.

TECHNICAL FIELD

The inventive concept relates to a MIT device and a fire detecting device including the MIT device and, more particularly, to a MIT device molded by a clear compound epoxy and a fire detecting device including the MIT device.

BACKGROUND ART

It is significant to manufacture a constant temperature type fire alarm detector operated by a lower power, as green technology. Constant temperature type fire detectors may be operated by a method using a bimetal or a method using a thermistor. According to the constant temperature type fire detector using the bimetal, aluminum may be oxidized at a contact point of the bimetal, so that it may not be operated at a predetermined set temperature. Additionally, an aluminum plate may have high cost. The constant temperature type fire detector using the thermistor may use three or more grounds, so that a stand by current may be great. Additionally, the constant temperature type fire detector using the thermistor may include ten parts for detecting a constant temperature, so that manufacture cost may increase. Furthermore, when the constant temperature type fire detector using the thermistor is operated for a long time, trouble rates of the parts may increase and durability of the parts may be deteriorated. Thus, alternative methods for solving the above problems have been required for a long time.

DETAILED DESCRIPTION

Technical Problem

Embodiments of the inventive concept may provide fire detectors which are capable of minimizing power consumption in ordinary times for being operated by a low power and have high reliability for a long time.

Embodiments of the inventive concept may also provide fire detectors capable of improving accuracy by reducing a cause disturbing normal operations of a resistance value and a setting temperature for a long time.

Embodiments of the inventive concept may also provide fire detector modules more responding to an ascending atmospheric current caused in a fire and reducing production cost by replacing a part used in a circuit with new one.

Technical Solution

According to embodiments of the inventive concepts, a metal-insulator transition (MIT) device includes: a MIT chip having a material causing a metal-insulator transition (MIT) phenomenon at a critical temperature; and a clear compound epoxy which molds the MIT chip.

In some embodiments, the clear compound epoxy layer may be formed of a clear compound epoxy which may include at least one of LMC 100G-SA, MG17, MG18, MG97-7000, MG97-8000, OP1000, OP7000, and STAYSTIK 371.

In other embodiments, the MIT device may further include: an input terminal and an output terminal electrically connected to the MIT chip. The input terminal and the output terminal may be coated with an insulating material. The MIT chip and the clear compound epoxy layer may be formed into a ladder type package.

In still other embodiments, the MIT device may further include: a first terminal connected to the MIT chip for receiving a signal; a second terminal connected to the MIT chip for output a signal; and a third terminal allowing external heat transfer and electrically insulated. The MIT chip and the clear compound epoxy layer may be formed into a chip type package. The MIT chip and the clear compound epoxy layer may be formed into a can type package for receiving an electromagnetic wave.

In even other embodiments, the MIT chip may be formed of one of VO2 and V2O3 which are vanadium oxides. The MIT device may further include: a second epoxy layer which molds the clear compound epoxy layer. The second epoxy layer may be formed of a clear compound epoxy or a colored compound epoxy.

According to embodiments of the inventive concept, a fire detecting device is supplied with a power source from a power control device. The fire detecting device includes a MIT device including a MIT chip molded by a clear compound epoxy; a diode bridge circuit supplied with the power source from the power control device, the diode bridge circuit for providing a non-polar power source; a notice circuit supplied with the non-polar power source from the diode bridge circuit, the notice circuit for warning of a fire alarm in response to a detecting signal from the MIT device; and a stabilization circuit for maintaining the detecting signal for a certain period.

In some embodiments, the diode bridge circuit may include an external electrostatic discharge (ESD) interruption device. The ESD interruption device may be realized by a zener diode. The notice circuit may include a light emitting device warning of the fire alarm by light.

In other embodiments, the stabilization circuit may include a PNP transistor and a NPN transistor. An emitter of the PNP transistor may be connected to a first terminal of the MIT device, a collector of the PNP transistor may be connected to a second terminal of the MIT device, and a base of the PNP transistor may be connected to a collector of the NPN transistor. An emitter of the NPN transistor may be connected to a ground terminal, and a base of the NPN transistor may be connected to the collector of the PNP transistor. A resistor and a capacitor may be connected in parallel between the second terminal and the ground terminal.

In still other embodiments, the MIT device, the diode bridge circuit, the notice circuit, and the stabilization circuit may be mounted on a T-shaped printed circuit board (PCB); and the T-shaped PCB may be installed in a direction vertical to a horizontal surface of a case. The case may include a ventilation opening.

In even other embodiments, the MIT device, the diode bridge circuit, the notice circuit, and the stabilization circuit may be mounted on a planar PCB; and the planar PCB may be spaced apart from a bottom of a case by a predetermined distance. The case may include a ventilation opening.

Advantageous Effects

According to embodiments of the inventive concept, since a temperature sensitive smoke detecting layer of a rapid metal-insulator transition material such as vanadium oxide is used as an active layer, stability may be increased or maximized. Additionally, the smoke sensor including the temperature sensitive smoke detecting layer of low cost may increase or maximize productivity. Moreover, the resistance variation may be reduced by the first epoxy layer, and the second epoxy layer is coated on the first epoxy layer, such that the first epoxy layer may be protected. The finally completed device may be further coated once, such that the stability may be maximized. If the circuits are constituted as the embodiment of FIG. 14, the stand by current may be reduced under 5 μA.

If the voltage applied to the MIT device is controlled, the operation temperature may be controlled. The board of the MIT device is stood, so that the MIT device may more rapidly react under the same a hot wind supplying condition.

DESCRIPTION OF DRAWINGS

The inventive concept will become more apparent in view of the attached drawings and accompanying detailed description.

BEST MODE FOR INVENTION

Figure 1:
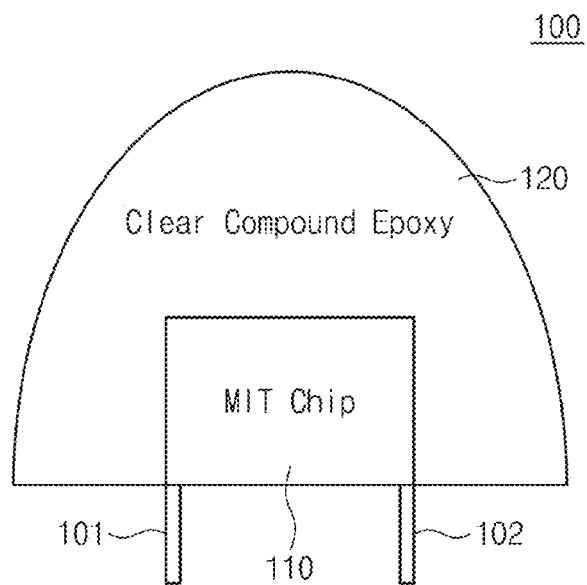
FIG. 1 is a conceptual diagram illustrating a metal-insulator transition (MIT) device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

FIG. 1 is a conceptual diagram illustrating a metal-insulator transition (MIT) device according to some embodiments of the inventive concept. Referring to FIG. 1, a metal-insulator transition (MIT) device 100 includes input/output terminals 101 and 102, a MIT chip 110, and a clear compound epoxy layer 120. In the MIT device 100 according to embodiments of the inventive concept, the MIT chip 110 is molded by the clear compound epoxy layer 120.

The MIT chip 110 is formed of a material having a property where a resistance is rapidly reduced at a specific temperature and by a specific voltage. The MIT chip 110 may include vanadium oxide (VO2), a ceramic of vanadium oxide (V2O3), or a thin film of vanadium oxide (V2O3). The clear compound epoxy layer 120 may be formed of LMC 100G-SA, MG17, MG18, MG97-7000, MG97-8000, OP1000, OP7000, or STAYSTIK 371. The MIT device 100 illustrated in FIG. 1 may be used for various purposes of a heat detecting sensor, an electromagnetic wave detecting sensor and a thermal switch.

Figure 2:
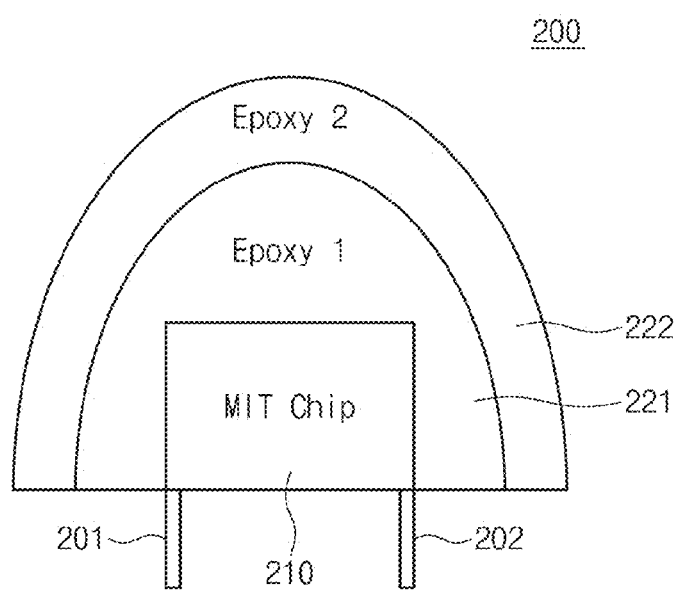
FIG. 2 is a conceptual diagram illustrating a MIT device according to other embodiments of the inventive concept.

FIG. 2 is a conceptual diagram illustrating a MIT device according to other embodiments of the inventive concept. Referring to FIG. 2, a MIT device 200 includes input/output terminals 201 and 202, a MIT chip 210, a first epoxy layer 221, and a second epoxy layer 222.

In the MIT device 200 illustrated in FIG. 2, the MIT chip 210 is molded by the first epoxy layer 221 and then the MIT chip 210 molded by the first epoxy layer 221 is further molded by the second epoxy layer 222. All the first and second epoxy layers 221 and 222 of the MIT device 200 may be formed of the clear compound epoxy. Alternatively, the first epoxy layer 221 may be formed of the clear compound epoxy and the second epoxy layer 222 may be formed of a colored compound epoxy including a pigment of a black color, etc. The first epoxy layer 221 may function as a protection layer preventing variation of a resistance, and the second epoxy layer 222 may be used for joining the MIT chip 210 molded by the first epoxy layer 221.

A first terminal 201 may be used as an input terminal and the second terminal 202 may be used as an output terminal. The MIT device 200 illustrated in FIG. 2 may be used as a heat detecting sensor, an electromagnetic wave detecting sensor and a thermal switch.

Figure 3:
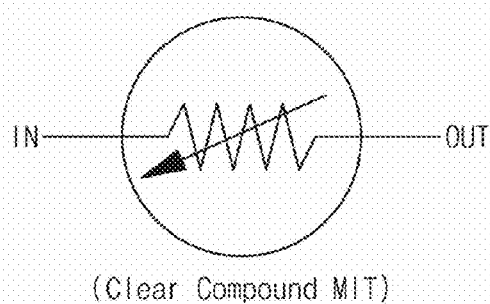
FIG. 3 is a circuit symbol illustrating a MIT device using a clear compound epoxy illustrated in FIG. 1 or FIG. 2.

FIG. 3 is a circuit symbol illustrating a MIT device using a clear compound epoxy illustrated in FIG. 1 or FIG. 2. Referring to FIG. 3, the MIT device has an input terminal IN and an output terminal OUT. The MIT device causes a metal-insulator transition phenomenon by a specific critical voltage or at a critical temperature, so that the MIT device has a property such as a variable resistance transferred from an insulator to a metal or from the metal to the insulator. The circuit symbol shows the variable resistance property. An outer circular part of the variable resistance conceptually shows the clear compound epoxy.

Figure 4:
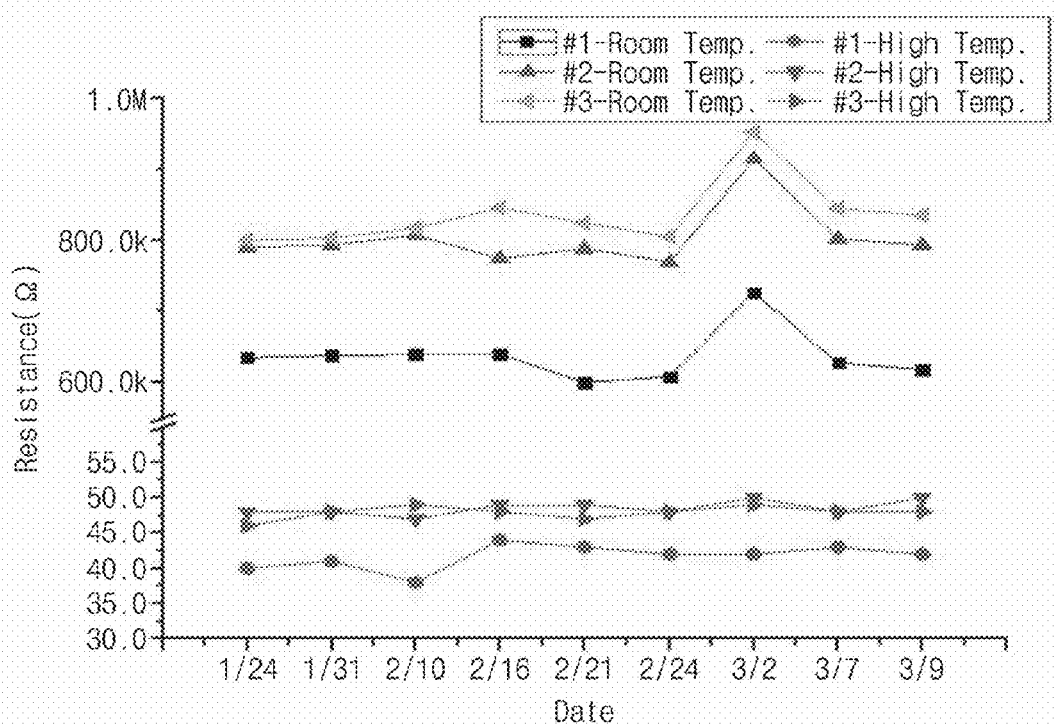
FIG. 4 is a graph illustrating a resistance value variation of a MIT device using a clear compound epoxy illustrated in FIG. 1 or FIG. 2.

FIG. 4 is a graph illustrating a resistance value variation of a MIT device using a clear compound epoxy illustrated in FIG. 1 or FIG. 2. Referring to FIG. 4, according to room temperature resistances measured on January 24, each of samples #2 and #3 was about 800 kΩ and a sample #1 was about 650 kΩ. Measured resistance values of the samples were a little bit fluctuated according to dates. However, the room temperature resistances values of the samples measured on January 24 and final room temperature resistance values of the samples measured on March 9 are not significantly different. In high temperature resistances (about 150° C.), a value of the sample #1 measured on January 24 was about 40Ω and each of values of the samples #2 and #3 was about 45Ω. The values measured on January 24 and final values measured on March 9 are not significantly different. Thus, differently from a general method of molding a MIT device, the MIT devices 110 and 210 molded by the clear compound epoxy may prevent the resistances thereof from being varied according to change of dates.

Figure 5:
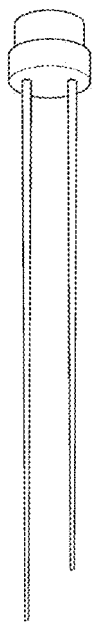
FIGS. 5 and 6 are photographs showing a real figure of a MIT device using a clear compound epoxy illustrated in FIG. 1 or FIG. 2.
Figure 6:
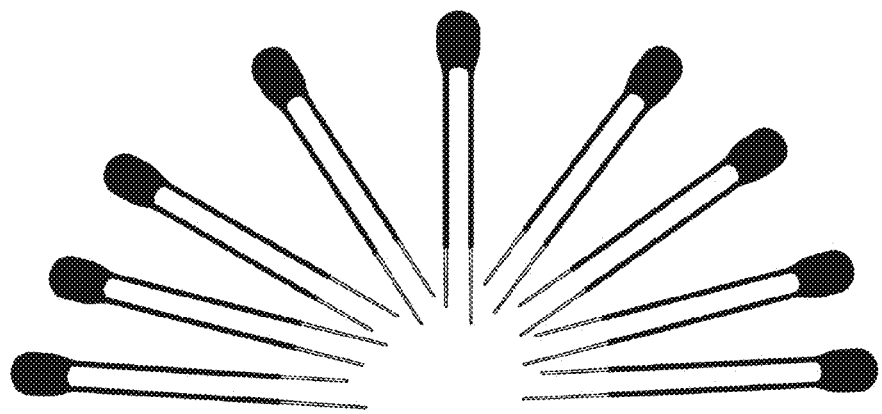

FIGS. 5 and 6 are photographs showing a real figure of a MIT device using a clear compound epoxy illustrated in FIG. 1 or FIG. 2. Referring to FIG. 5, the MIT device may be packaged in ladder type. The ladder type MIT device has two terminals. Referring to FIG. 6, first and second terminals of the ladder type MIT device may be coated with an electrical insulating material by a thickness of 1 cm or more.

Figure 7:
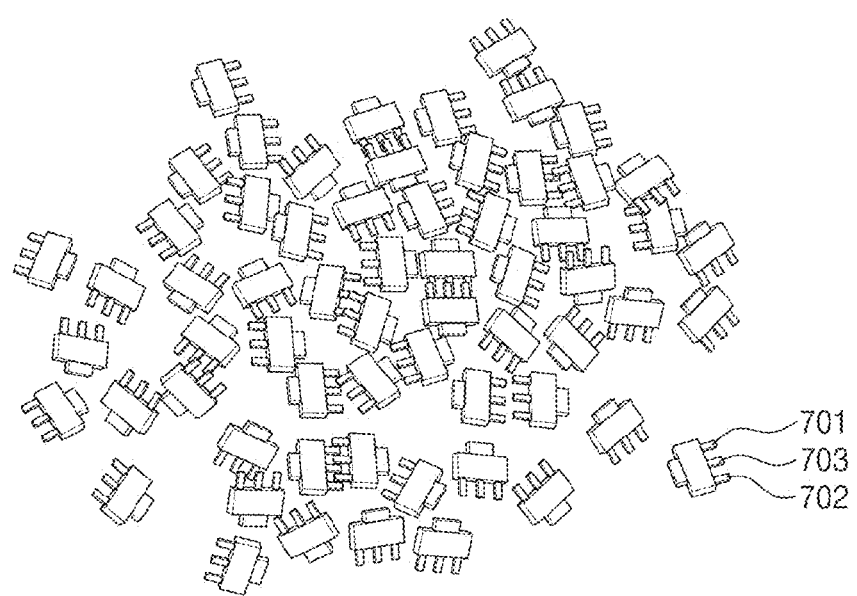
FIGS. 7 and 8 are photographs showing modified examples of a MIT device using a clear compound epoxy illustrated in FIG. 1 or FIG. 2.
Figure 8:
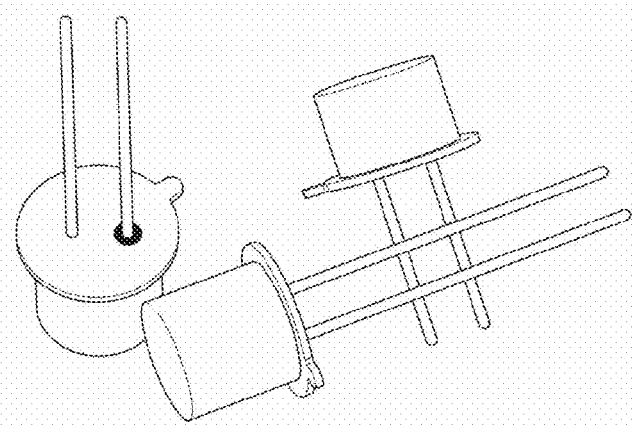

FIGS. 7 and 8 are photographs showing modified examples of a MIT device using a clear compound epoxy illustrated in FIG. 1 or FIG. 2. FIG. 7 shows a chip type package including the input terminal (701), the output terminal (702), and a third terminal (703). The third terminal allows heat transfer externally and is electrically insulated. FIG. 8 shows a can type package having the MIT chip covered by the clear compound epoxy layer and a front side opened for receiving an electromagnetic wave.

Figure 9:
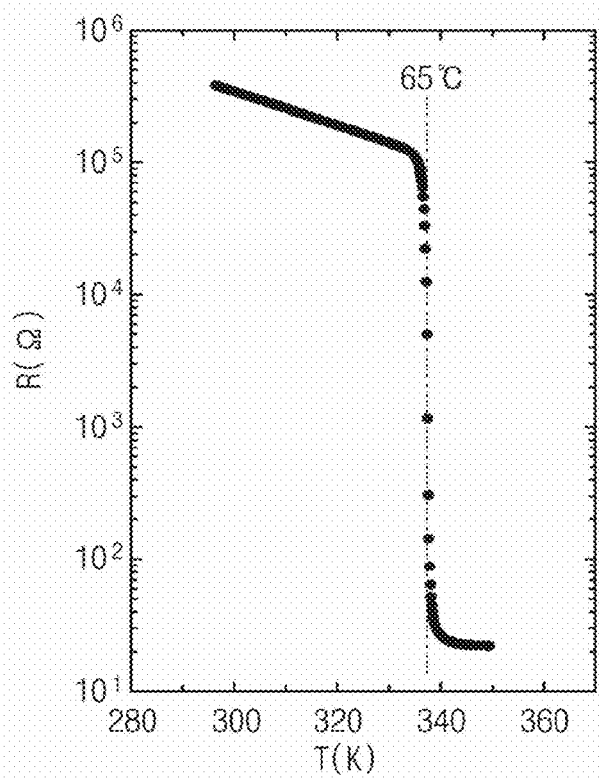
FIG. 9 is a graph illustrating a resistance variation according to a temperature of a MIT device formed of a vanadium oxide (VO2)

FIG. 9 is a graph illustrating a resistance variation according to a temperature of a MIT device formed of a vanadium oxide (VO2). Referring to FIG. 9, a horizontal axis of the graph represents an absolute temperature (K) and a vertical axis of the graph represents a resistance (Ω).

The MIT device has a MIT property. In other words, the MIT device has a resistance value of about $3 \times 10^5 \Omega$ at 290 K and then the resistance value of the MIT device is reduced by about 1/10000 when a temperature of the MIT device approaches about 340 K (i.e., 65° C.). Thus, the MIT has the resistance value of several tens Ω at about 340 K (i.e., 65° C.). This temperature point is defined as a critical temperature.

Meanwhile, the MIT device has a high resistance of about 10 kΩ or more under the absolute temperature of about 340 K, such that the MIT device have a property of an insulator. But, the resistance of the MIT device is rapidly reduced at about 340 K (i.e., 65° C.), such that the MIT represent a property of a metal having a resistance of about several tens Ω. The rapid resistance change of the MIT device is because the metal-insulator transition phenomenon is caused at about 65° C. Thus, the critical temperature of the MIT device may be about 65° C.

The metal-insulator transition of the MIT device formed of VO2 is caused at about 65° C. However, the critical temperature of the MIT device may be changed by doping a proper material into the MIT device. Additionally, materials or structures of elements constituting the MIT device may be changed so that the critical temperature of the MIT device may be changed.

Figure 10:
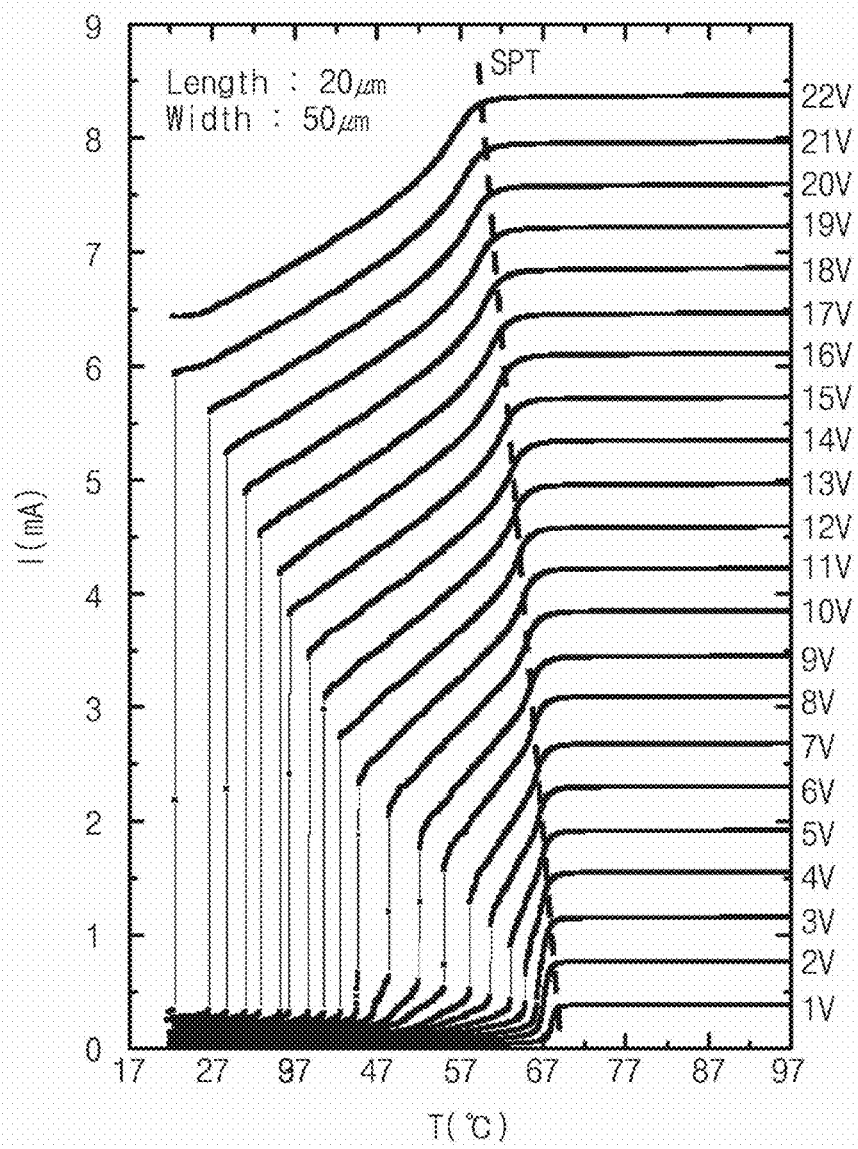
FIG. 10 is a graph illustrating a current variation according to a temperature measured over applying a voltage to a MIT device formed of a vanadium oxide (VO2)

FIG. 10 is a graph illustrating a current variation according to a temperature measured over applying a voltage to a MIT device formed of a vanadium oxide (VO2). In FIG. 10, a horizontal axis represents a temperature T (° C.), and a vertical axis represents a current (mA). FIG. 10 shows a typical current curve of VO2 when voltages of 1V to 22V are applied to the MIT device. In other words, if this is represented as the resistance with respect to the temperature, the graph of FIG. 9 is obtained.

It is confirmed that the current follows Ohm's law after the current jumps at the critical temperature of each of the applied voltages. The current is a little reduced near about 68° C. as the voltage becomes higher. This means that a structure is changed from an orthorhombic system to a tetragonal system. In other words, a phase transition from the orthorhombic system to a tetragonal system occurs in the VO2 at 68° C. Thus, the metal-insulator transition occurs to cause electrical resistance change. This is a feature different from the metal-insulator transition (MIT) according to the critical temperature. In other words, the structure phase transition does not occur in the MIT. Contents relative to those are confirmed in previous patents relative to a MIT device.

The critical temperature of the MIT used in a power transistor heat control circuit may be changed by changing an applied voltage. A temperature of heat generated from the power transistor may be arbitrarily set and then controlled using the MIT device having the variable critical temperature. A variable resistor may be connected in series to the MIT device, thereby easily changing the voltage applied to the MIT device.

Referring to FIG. 10 again, the critical temperature of the MIT device becomes lower as the voltage becomes higher. This phenomenon is called a programmable critical temperature switch and is one of properties of the MIT. This is public on the paper 'APPLIED PHYSICS LETTERS 90, 023515 (2007)'.

The voltage applied to the MIT device may be controlled using the intermediate phase phenomenon of FIG. 10 so that a fire detecting temperature of a firer detecting device may be changed. As the applied voltage becomes closer to the critical voltage (i.e., 21.5V) of the MIT device, the critical temperature of the MIT device approaches a room temperature. When the voltage of 22V is applied to the MIT device, only Ohm's law is shown and the critical temperature is not represented. In other words, if a voltage greater than the critical voltage is applied, the rapid MIT by the voltage is caused. Thus, the rapid MIT by the temperature does not be caused.

Figure 11:
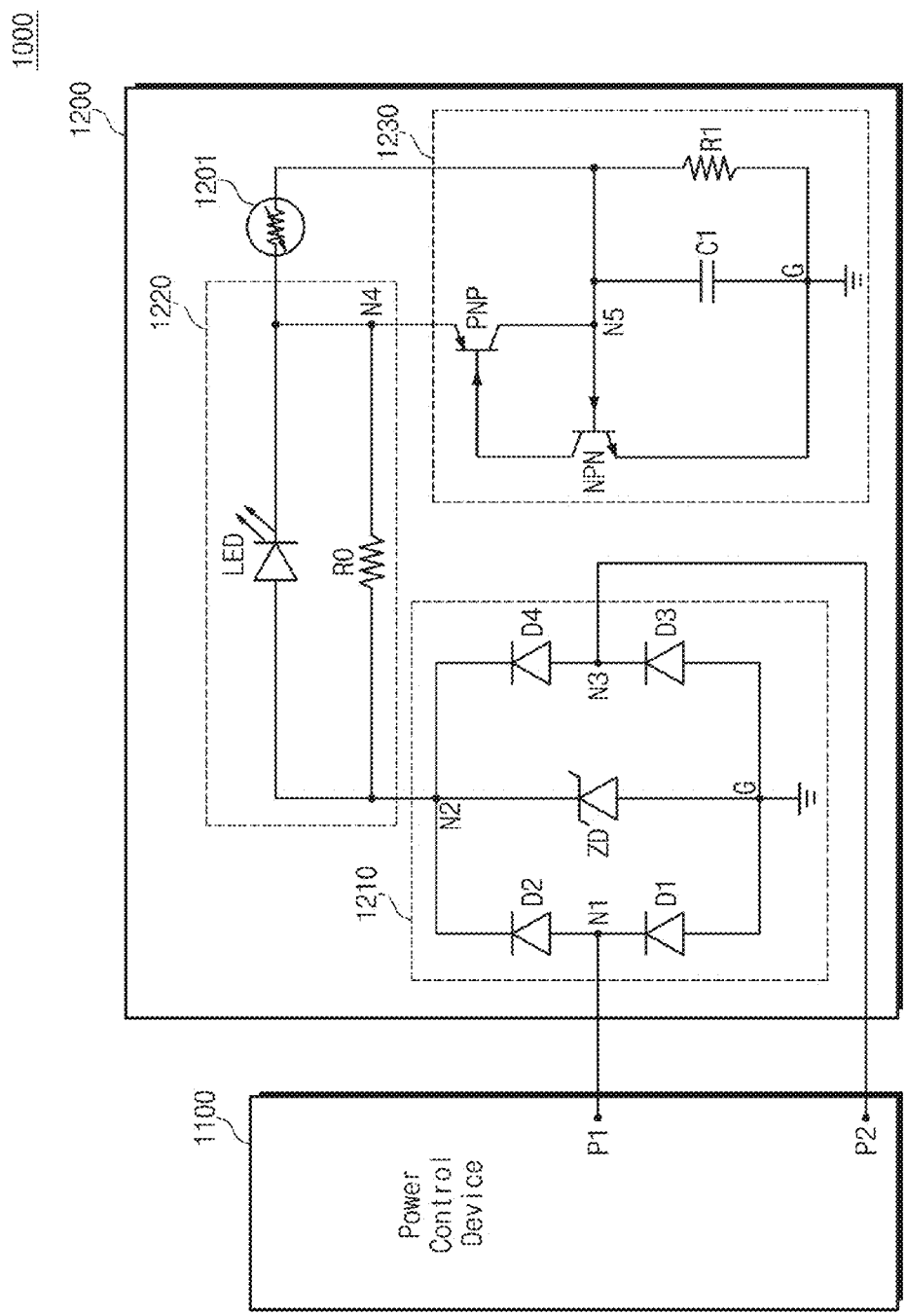
FIG. 11 is a circuit diagram illustrating a fire detecting system according to embodiments of the inventive concept.

FIG. 11 is a circuit diagram illustrating a fire detecting system according to embodiments of the inventive concept. Referring to FIG. 11, a fire detecting system 1000 includes a power control device 1100 and a fire detecting device 1200.

The power control device 1100 may supply a power source to the fire detecting device 1200. In FIG. 11, the power control device 1100 is separated from the fire detecting device 1200. Alternatively, the power control device 1100 may be included in the fire detecting device 1200. In other embodiments, a plurality of fire detecting devices 1200 may be connected to a single power control device 1100.

The power control device 1100 is used for supplying the power source to the fire detecting device 1200. Additionally, the power control device 1100 may autonomously generate an alarm signal. In other words, when the power control device 110 reaches a specific temperature, it may provide a constant current to operate a relay, a light emitting device (LED), or a buzzer. Thus, the fire may become known to a user.

Referring to FIG. 11 again, the fire detecting device 1200 includes a MIT device 1201, a diode bridge circuit 1210, a notice circuit 1220, and a stabilization circuit 1230. The MIT device 1201 includes the MIT chip having the property rapidly reducing the resistance at the specific temperature and the specific voltage and the clear compound epoxy which molds the MIT chip, as described with reference to FIGS. 1 and 2.

The diode bridge circuit 1210 is capable of supplying a non-polar power source. The diode bridge circuit 1210 includes first to fourth diodes D1 to D4 and a zener diode ZD. The first diode D1 is connected between a ground terminal G and a first node N1. The second diode D2 is connected between the first node N1 and a second node N2. The third diode D3 is connected between the ground terminal G and a third node N3. The fourth diode D4 is connected between the third node N3 and the second node N2. Meanwhile the zener diode ZD is connected between the ground terminal G and the second node N2.

The first node N1 of the diode bridge circuit 1210 is connected to a first power control terminal P1 of the power control device 1100, and the third node N3 is connected to a second power control terminal P2 of the power control device 1100. The diode bridge circuit 1210 may be supplied with the power source (e.g., a direct current (DC) power source) through the first and third nodes N1 and N3. And the diode bridge circuit 1210 may supply the power source to the inside thereof through the second node N2. At this time, the zener diode ZD may interrupt a strong external electrostatic discharge (ESD) noise which may be supplied from the power control device 1100 to the fire detecting device 1200. In the inventive concept, a different kind of an ESD interruption device such as a varistor instead of the zener diode may be used for interrupting the ESD noise.

The notice circuit 1220 is a circuit for inform the user of the fire. The notice circuit 1220 may include a light emitting device LED and a resistor R0. The resistor R0 protects the light emitting device LED. The resistor R0 is connected in parallel to the light emitting device LED between the second node N2 and the fourth node N4. The notice circuit 1220 may use a voice device such as a buzzer or an alarm instead of the light emitting device LED to inform the user of the fire. Referring to FIG. 11, the notice circuit 1220 is connected in series to the MIT device 1201. The notice circuit 1220 receives a detecting signal from the MIT device 1201 at a specific temperature and then informs the user of the fire warning through the light emitting device LED.

Referring to FIG. 11, the stabilization circuit 1230 includes a PNP transistor, a NPN transistor, a resistor R1, and a capacitor C1. An emitter of the PNP transistor is connected to the fourth node N4, a collector of the PNP transistor is connected to a fifth node N5, and a base of the PNP transistor is connected to a collector of the NPN transistor. An emitter of the NPN transistor is connected to the ground terminal G and a base of the NPN transistor is connected to the fifth node N5. The resistor R1 and the capacitor C1 are connected in parallel between the fifth node N5 and the ground terminal G. The MIT device 1201 is connected between the fourth node N4 and the fifth node N5.

The stabilization circuit 1230 illustrated in FIG. 11 may be used for preventing a self-heating phenomenon of the MIT device 1201 or for maintaining the fire alarm signal during a certain period. The function of the stabilization circuit 1230 preventing the self-heating phenomenon of the MIT device 1201 will be described with reference to FIG. 12, and the function of the stabilization circuit 1230 maintaining the fire alarm signal during the certain period will be described with reference to FIG. 14.

Figure 12:
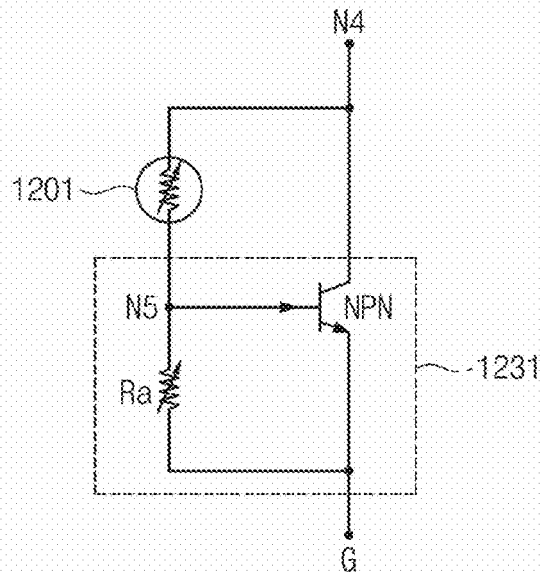
FIG. 12 is a circuit diagram for explaining a MIT device self-heating prevention function of a stabilization circuit illustrated in FIG. 11.

FIG. 12 is a circuit diagram for explaining a MIT device self-heating prevention function of a stabilization circuit illustrated in FIG. 11. Referring to FIG. 12, a stabilization circuit 1231 is connected to the MIT device 1201 and includes a NPN transistor and a resistor Ra. The MIT device 1201 is connected between the fourth node N4 and the fifth node N5. A collector of the NPN transistor is connected to the fourth node N4, an emitter of the NPN transistor is connected to the ground terminal G, and a base of the PNP transistor is connected to the fifth node N5. The resistor Ra is connected between the fifth node N5 and the ground terminal G. In FIG. 12, a PNP transistor or a metal-oxide semiconductor (MOS) transistor may be replaced with the NPN transistor. If the PNP transistor is supplied to the stabilization circuit 1231, polarities of electrodes of the PNP transistor have to be oppositely connected.

An MIT device self-heating preventing operation of the stabilization circuit 1231 of FIG. 12 will be described briefly. For example, when a temperature increases by an over-current in an inner circuit of the fire detecting device 1200 of FIG. 11, the MIT phenomenon is caused in the MIT device 1201, such that a great current flows through the MIT device 1201. The bipolar transistor is turned-off by a small voltage difference between the emitter and the base before the MIT phenomenon is caused. In other words, the most part of the voltage is applied to the MIT device 1201 and a very small voltage is applied to the resistor Ra. The voltage difference between the emitter and the base does not exceed a threshold voltage value.

However, if the MIT phenomenon is caused in the MIT device, the MIT device 1201 becomes in metal state, such that a great current flows through the MIT device 1201. Thus, a small voltage is applied to the MIT device 1201 but a large voltage is applied to the resistor Ra. In other words, a large voltage is applied to the base. Thus, the NPN transistor is turned-on and a current flows to the NPN transistor. As a result, the current flowing to the MIT device 1201 is reduced. And then the MIT device 1201 returns to an insulating state with the current reduction, such that the NPN transistor returns to the turn-off state.

Figure 13:
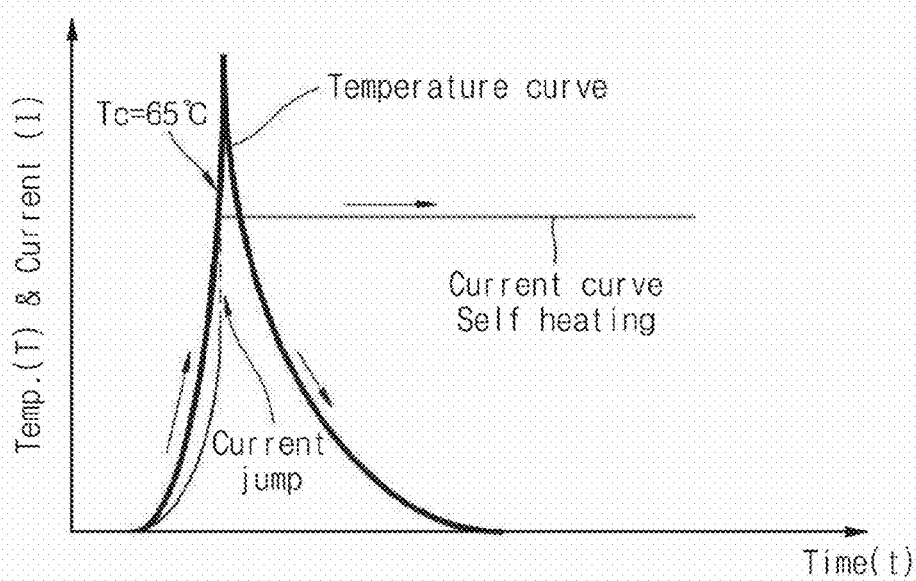
FIG. 13 is a graph illustrating a self-heating phenomenon of a MIT device illustrated in a circuit of FIG. 12.

FIG. 13 is a graph illustrating a self-heating phenomenon of a MIT device illustrated in a circuit of FIG. 12. FIG. 13 shows variations of the temperature and the current of the MIT device with respect to a time. In FIG. 13, an X-axis represents the time, and a Y-axis represents the temperature and the current. A thick line in FIG. 13 is a temperature curve of a peripheral circuit of the MIT device and a thin line in FIG. 13 is a current curve of the current flowing through the MIT device.

Referring to FIG. 13, if a peripheral temperature becomes the critical temperature (e.g., 65° C.) or more, the MIT device is transited to the metal state (or the turn-on state) by the MIT phenomenon, such that discontinuous current jump (a dot line part) occurs and the great current (a current density of 105 A/cm$^2$) flows through the MIT device. As a result, the peripheral temperature (i.e., the temperature of the peripheral circuit) is reduced under the critical temperature.

Meanwhile, if the peripheral temperature is reduced under the critical temperature, the MIT device returns to the insulating state (or the turn-off state) and then the current of the MIT device has to be reduced. However, even though the peripheral temperature is reduced under the critical temperature, the great current flowing through the MIT device may be maintained. This phenomenon is caused by the self-heating of the MTI device. This phenomenon is defined as the MIT device self-heating phenomenon. Since the great current continuously flows by the self-heating of the MIT device, a switching function of the MIT device is interrupted to interrupt a normal operation of the peripheral circuit or to cause operation error of the peripheral circuit.

In the stabilization circuit 1231 illustrated in FIG. 12, the current is bypassed through the NPN transistor which is turned-on directly after occurrence of the MIT phenomenon. Thus, the stabilization circuit 1231 may prevent the self-heating of the MIT device 1201. As a result, it is possible to prevent the great current generated under the critical temperature by the MIT device self-heating phenomenon. Thus, the MIT device 1201 can perform the normal switching operation, such that the peripheral circuit may also safely perform the functions thereof.

Figure 14:
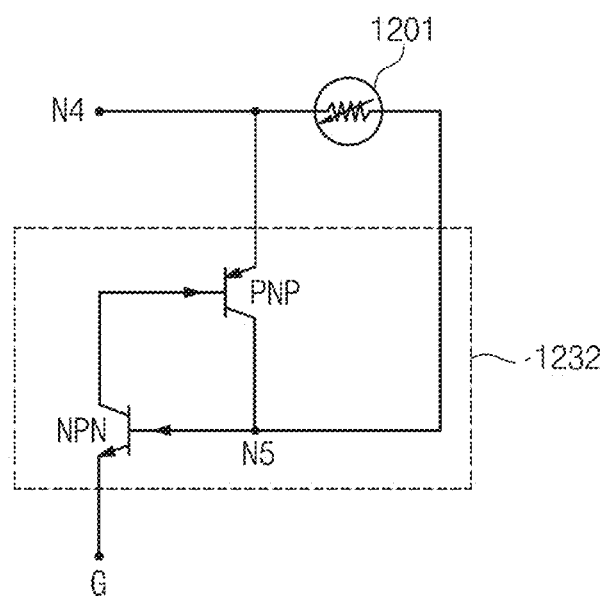
FIG. 14 is a circuit diagram for explaining a fire alarm signal maintenance function of a stabilization circuit illustrated in FIG. 11.

FIG. 14 is a circuit diagram for explaining a fire alarm signal maintenance function of a stabilization circuit illustrated in FIG. 11. Referring to FIG. 14, in a stabilization circuit 1232, an emitter of a PNP transistor is connected to the MIT device 1201, a collector of the PNP transistor is connected to a base of a NPN transistor, and a base of the PNP transistor is connected to a collector of the NPN transistor. Thus, the stabilization circuit 1232 can maintain a uniform current over the critical temperature of the MIT device 1201.

In other words, if a predetermined current flows through the PNP transistor, the voltage of the fifth node N5 ascends. If the voltage of the fifth node N5 ascends, a current flows through the NPN transistor. If the current flows through the NPN transistor, the current uniformly flows through the PNP transistor.

Referring to FIG. 11 again, the stabilization circuit 1230 not only prevents the self-heating phenomenon of the MIT device 1201 but also maintains the fire alarm signal for the certain period as described above. Additionally, since the stabilization circuit 1230 includes the resistor R1 and the capacitor C1, the stabilization circuit 1230 may control a stand by current. Here, a variable resistor may be used as the resistor R1. On the other hand, a SCR may be replaced with the two transistors in the stabilization circuit 1230 illustrated in FIG. 1, and a fire alarm LED or buzzer may be connected to the stabilization circuit 1230.

As described above, the fire detecting system 1000 illustrated in FIG. 11 includes the power control device 1100 and the fire detecting device 1200, and the fire detecting device 1200 includes the MIT device 1201 including the MIT chip molded by the clear compound epoxy. The fire detecting temperature of the fire detecting system 1000 may be set in a specific range suitable to the user. For example, the fire detecting system 1000 may be set to have a detecting range of about 50° C. to about 75° C. On the other hand, the fire detecting device 1200 includes the MIT device 1201, the diode bridge circuit 1210, the notice circuit 1220, and the stabilization circuit 1230, and the whole fire detecting device 1200 may be coated with an insulating material for waterproofing.

Figure 15:
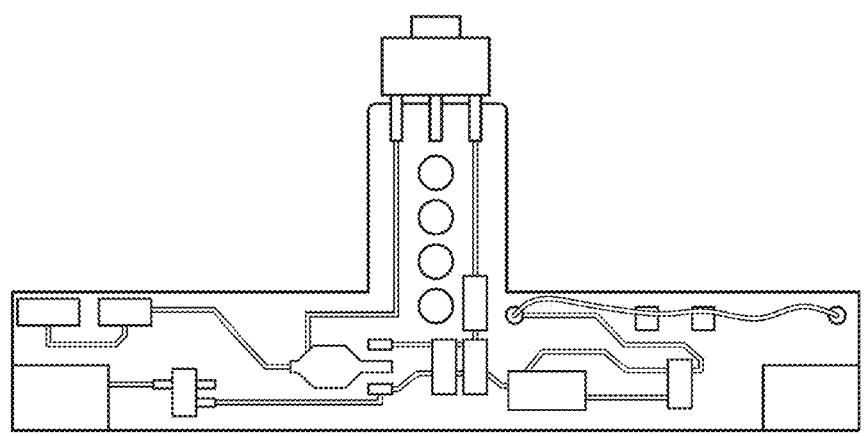
FIGS. 15 to 18 show an example of a T-shaped printed circuit board (PCB) on which devices of a fire detecting device 1200 of FIG. 11 are mounted.
Figure 16:
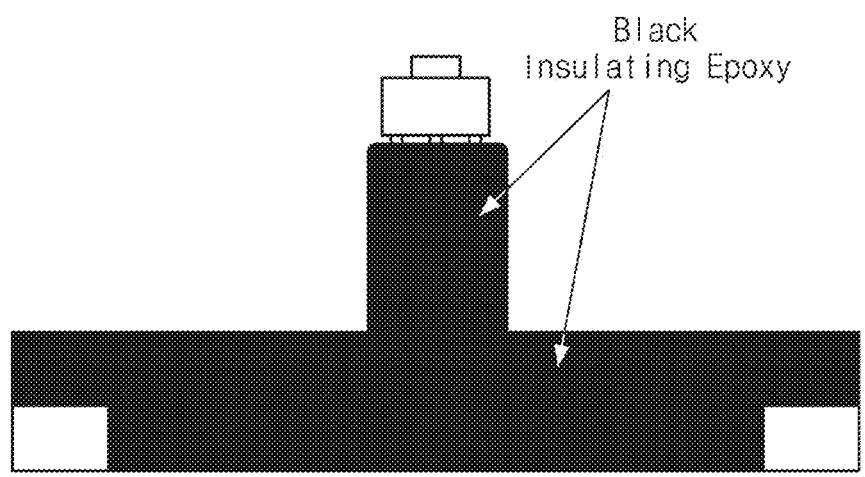

FIGS. 15 to 18 show an example of a T-shaped printed circuit board (PCB) on which devices of a fire detecting device 1200 of FIG. 11 are mounted. FIG. 15 is a photograph of a T-shaped PCB on which the MIT device 1201, the diode bridge circuit 1210, the notice circuit 1220, and the stabilization circuit 1230 of FIG. 11 are mounted. FIG. 16 is a photograph of the T-shaped PCB of FIG. 15 which is coated with a black insulating epoxy for water proofing.

Figure 17:
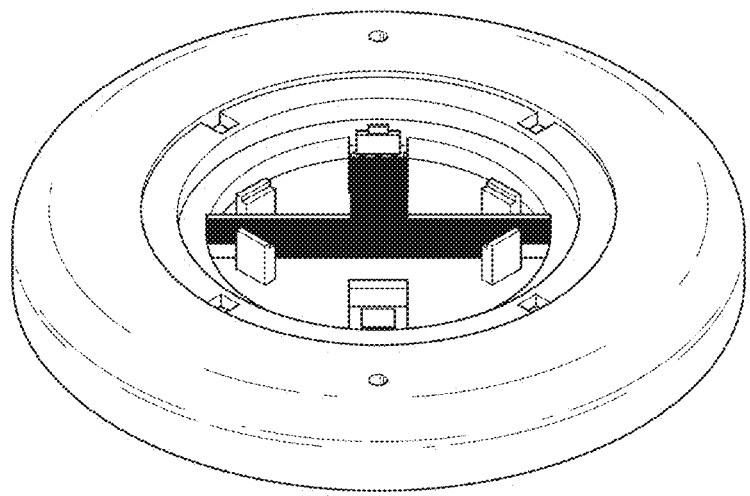
Figure 18:
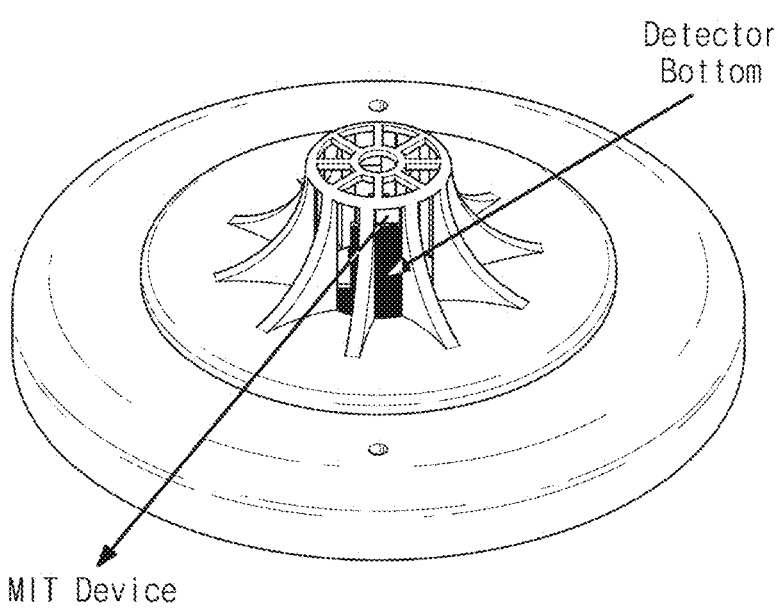

FIGS. 17 and 18 shows an example of the fire detecting device in which the T-shaped PCB illustrated in FIG. 15 or 16 is installed. As illustrated in FIG. 17, the T-shaped PCB is installed in a direction vertical to a horizontal surface of a case of the fire detecting device. In FIG. 17, the MIT device 1201 of FIG. 11 protrudes from an end part of the T-shaped PCB by about 1 cm.

Referring to FIG. 18, the T-shaped PCB of the fire detecting device is spaced apart from a detector bottom by about 1 cm. And the case of the fire detecting device may include an O-shaped ventilation opening for increasing a sensing sensitivity of heat flow when the fire occurs. In other words, the case of the fire detecting device has the opening in order that an air easily flows, and the opening has a small size in order that a finger is not inserted in the opening for protecting the MIT device.

Figure 19:
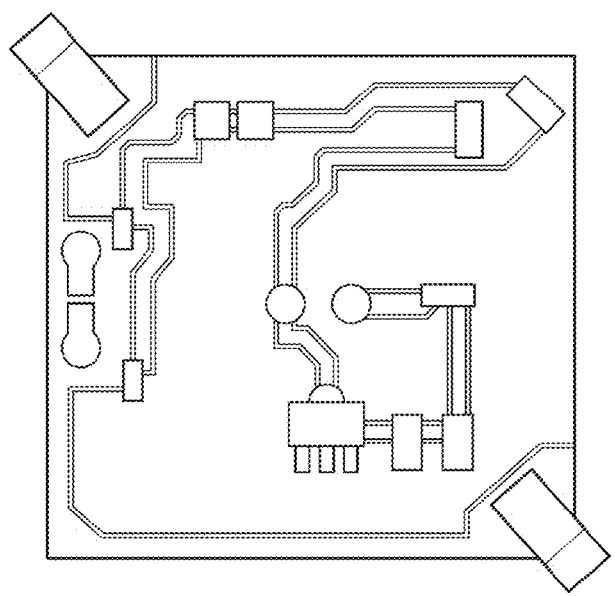
FIGS. 19 to 23 show an example of a planar PCB on which devices of a fire detecting device 1200 of FIG. 11 are mounted.
Figure 20:
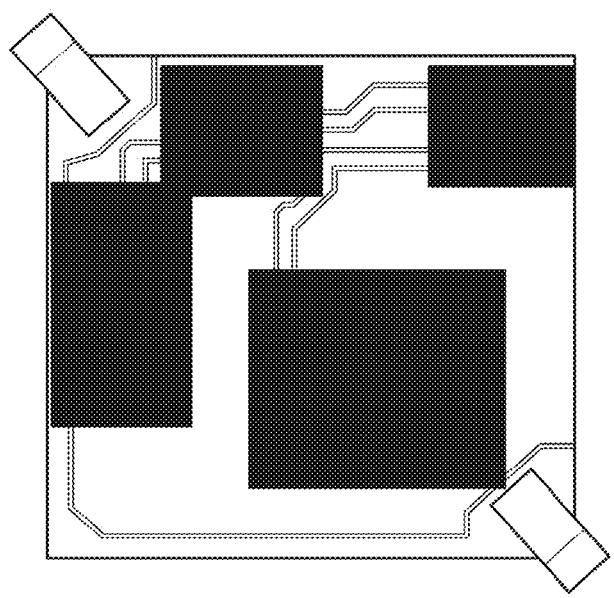

FIGS. 19 to 23 show an example of a planar PCB on which devices of a fire detecting device 1200 of FIG. 11 are mounted. FIG. 19 is a photograph of a planar PCB on which the MIT device 1201, the diode bridge circuit 1210, the notice circuit 1220, and the stabilization circuit 1230 of FIG. 11 are mounted. FIG. 20 is a photograph of the planar PCB of FIG. 19 which is coated with an insulating epoxy for water proofing.

Figure 21:
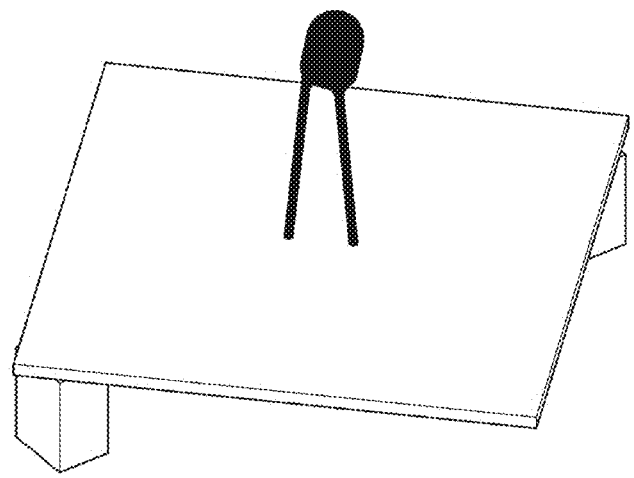
Figure 22:
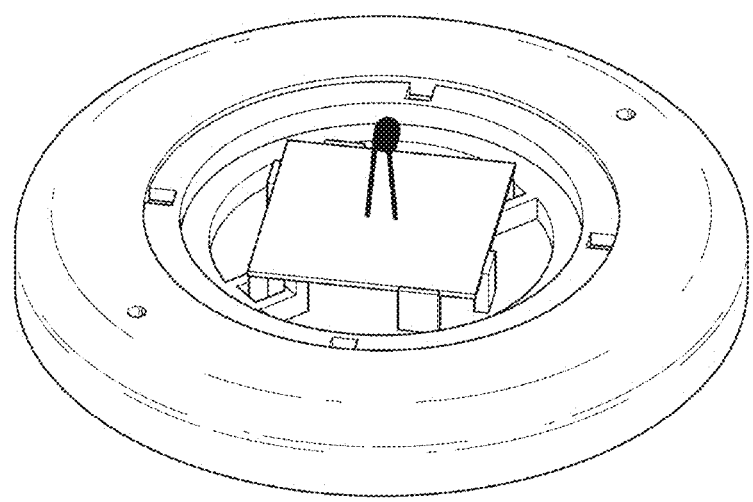
Figure 23:
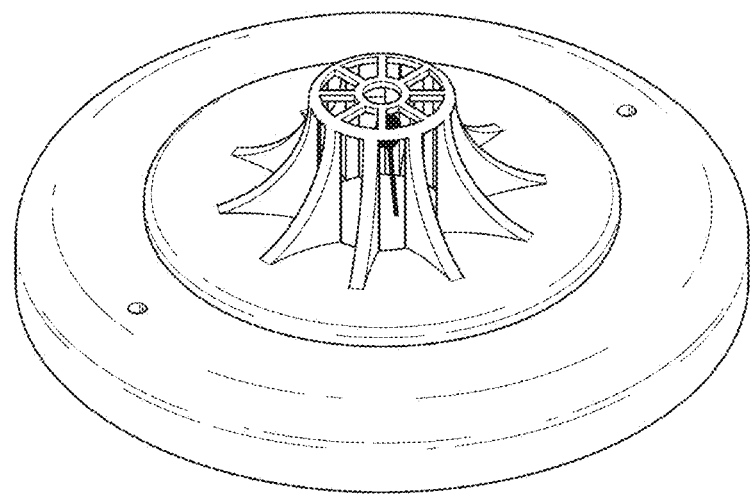

FIG. 21 is a photograph of the MIT device installed on the planar PCB. Referring to FIG. 21, the MIT device is installed to be higher from a horizontal surface of the planar PCB by about 1 cm or more. Referring to FIG. 22, the planar PCB is spaced apart from a detector bottom by about 1 cm. FIG. 23 is a photograph showing a completed fire detecting device. Referring to FIG. 23, a case of the fire detecting device include an O-shaped ventilation opening, and the opening may be formed to have a small size in order that a finger is not inserted in the opening for protecting the MIT device.

MODE FOR THE INVENTION

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A fire detecting device supplied with a power source from a power control device, comprising:
   a MIT device including a MIT chip molded by a clear compound epoxy;
   a diode bridge circuit supplied with the power source from the power control device, the diode bridge circuit for providing a non-polar power source;
   a notice circuit supplied with the non-polar power source from the diode bridge circuit, the notice circuit for warning of a fire alarm in response to a detecting signal from the MIT device; and
   a stabilization circuit for maintaining the detecting signal for a certain period.

2. The fire detecting device of claim 1, wherein the diode bridge circuit includes an external electrostatic discharge (ESD) interruption device.

3. The fire detecting device of claim 2, wherein the ESD interruption device is realized by a zener diode.

4. The fire detecting device of claim 1, wherein the notice circuit includes a light emitting device warning of the fire alarm by light.

5. The fire detecting device of claim 1, wherein the stabilization circuit includes a PNP transistor and a NPN transistor;

wherein an emitter of the PNP transistor is connected to a first terminal of the MIT device, a collector of the PNP transistor is connected to a second terminal of the MIT device, and a base of the PNP transistor is connected to a collector of the NPN transistor; and wherein an emitter of the NPN transistor is connected to a ground terminal, and a base of the NPN transistor is connected to the collector of the PNP transistor.

6. The fire detecting device of claim 5, wherein a resistor and a capacitor are connected in parallel between the second terminal and the ground terminal.

7. The fire detecting device of claim 1, wherein the MIT device, the diode bridge circuit, the notice circuit, and the stabilization circuit are mounted on a T-shaped printed circuit board (PCB); and wherein the T-shaped PCB is installed in a direction vertical to a horizontal surface of a case.

8. The fire detecting device of claim 7, wherein the case includes a ventilation opening.

9. The fire detecting device of claim 1, wherein the MIT device, the diode bridge circuit, the notice circuit, and the stabilization circuit are mounted on a planar PCB; and wherein the planar PCB is spaced apart from a bottom of a case by a predetermined distance.

10. The fire detecting device of claim 9, wherein the case includes a ventilation opening.

* * * * *